United States Patent [19]
Ross

[11] Patent Number: 5,983,384
[45] Date of Patent: Nov. 9, 1999

[54] TURBO-CODING WITH STAGED DATA TRANSMISSION AND PROCESSING

[75] Inventor: John Anderson Fergus Ross, Schenectady, N.Y.

[73] Assignee: General Electric Company, Schenectady, N.Y.

[21] Appl. No.: 08/845,095

[22] Filed: Apr. 21, 1997

[51] Int. Cl.[6] ........................... H03M 13/00; G06F 11/10
[52] U.S. Cl. ............................................ 714/755; 714/788
[58] Field of Search .................................. 714/755, 757, 714/758, 752, 751, 748, 746, 790, 786, 787, 788, 48, 49; 364/265, 265.2, 265.1, 943.9, 944.5

[56] References Cited

U.S. PATENT DOCUMENTS

| | | | |
|---|---|---|---|
| 5,446,747 | 8/1995 | Berrou | 714/788 |
| 5,721,745 | 2/1998 | Haladik et al. | 714/755 |
| 5,721,746 | 2/1998 | Haladik et al. | 714/755 |
| 5,734,962 | 3/1998 | Hladik et al. | 455/12.1 |

OTHER PUBLICATIONS

"The TURBO Coding Scheme," Jakob Dahl Andersen, Report IT–146 ISSN 0105–854, Jun. 1994, Institute of Telecommunication, Technical University of Denmark, pp. 1–42.

"Near Shannon Limit Error–Correcting Coding and Decoding: Turbo–Codes (1)," Claude Berrou, Alain Glavieux, Punya Thitimajshima, 1993 IEEE, pp. 1064–1070, Feb. 1993.

"Illuminating the Structure of Code and Decoder of Parallel Concatenated Recursive Systematic (Turbo) Codes," Patrick Robertson, 1994 IEEE, pp. 1298–1303.

*Primary Examiner*—Trinh L. Tu
*Attorney, Agent, or Firm*—Jill M. Breedlove; Douglas E. Stoner

[57] ABSTRACT

Turbo-coding in a communications system involves coding/decoding information in stages in order to avoid retransmission of a full L-bit packet upon occurrence of a packet error. In addition to a set of code bits generated by an encoder using a turbo-coding scheme, a punctured set of code bits is generated and stored in transmitter memory. The original set of code bits is transmitted as an L-bit data packet to a receiver which stores received data samples corresponding to the original set of code bits. The receiver decodes the data packet using a turbo-decoder and determines whether the data packet has been received in error. If so, the received data samples are maintained in memory, and a request for more information is made. Some or all of the punctured information is then forwarded from the transmitter to the receiver. A second stage of turbo-decoding combines the new data samples with the stored original received data samples such that there is a high likelihood that decoding is correct at this point, but additional stages of decoding may be used.

10 Claims, 5 Drawing Sheets

TURBO-CODING WITH STAGED DATA TRANSMISSION AND PROCESSING

BACKGROUND OF THE INVENTION

The present invention relates generally to coding in communications systems and, more particularly, to turbo-coding information in stages.

Turbo-coding is known in the art as another term for parallel concatenated convolutional coding. More specifically, turbo-coding involves encoding an information sequence twice, the second encoding being performed after a random interleaving of the information sequence. Decoding is performed iteratively, and the result is reliable communication.

In many communications systems, data is transmitted in L-bit packets, where L is typically on the order of between ten and several hundred. If the receiver determines that the packet has been received in error, there may be a request to retransmit the information, referred to as an automatic repeat request (ARQ). Disadvantageously, this results in the transmission of a total of 2L bits.

Accordingly, it is desirable to provide a method and apparatus for turbo-coding which does not require a full L-bit packet to be retransmitted upon occurrence of a packet error.

SUMMARY OF THE INVENTION

A method and apparatus for turbo-coding stages of information in a communications system avoids retransmission of a full L-bit packet upon occurrence of a packet error. In accordance therewith, in addition to a set of code bits generated by an encoder using a turbo-coding scheme, a punctured set of code bits is generated and stored in transmitter memory. The original set of code bits is transmitted as an L-bit data packet, via a channel, to a receiver which stores the received data samples corresponding to the original set of code bits. The receiver decodes the data packet using a turbo-decoder and determines whether the data packet has been received in error. If so, the received data samples are maintained in memory, and a request for more information is made. Some or all of the punctured information is then forwarded from the transmitter, via the channel, to the receiver. A second stage of turbo-decoding combines the new (i.e., punctured) data samples with the stored original received data samples. Decoding is likely to be correct at this point. However, it may be desirable to have three or more transmission stages of decoding, depending upon the application.

DETAILED DESCRIPTION OF THE INVENTION

Figure 1:
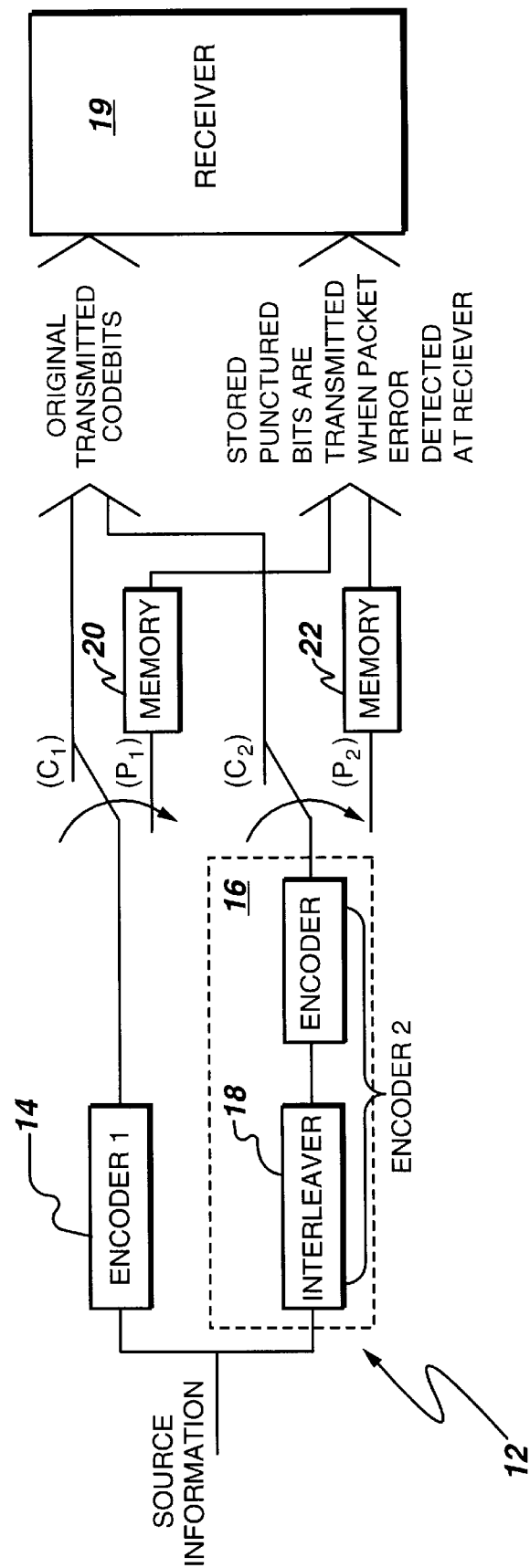
FIG. 1 is a block diagram illustrating a turbo-coding scheme with staged information transmission according to an embodiment of the present invention.

FIG. 1 illustrates a turbo-coding scheme with staged information transmission according to an embodiment of the present invention. In FIG. 1, a turbo encoder 12 encodes source information using a parallel concatenation of two convolutional codes in encoder 14 and in encoder 16, typically referred to in the art as Encoder 1 and Encoder 2, respectively. The second encoder, encoder 16, performs the second encoding after random interleaving in an interleaver 18.

The code bits C1 and C2 are transmitted via a channel to a receiver 19. A set of data samples corresponding to the original transmitted code bits C1 and C2 from encoder 16 and encoder 18, respectively, are received by receiver 19 and stored in receiver memory. A punctured set of code bits P1 and P2, respectively, corresponding to code bits C1 and C2, respectively, is also generated by encoder 12 and stored in transmitter memory 20 and memory 22, respectively.

As known in the art, an encoder applies a puncturing process to a convolutional code by deleting some output bits according to a predetermined puncturing pattern in order to increase the rate of the resulting code. The associated decoder in receiver 19 includes a corresponding depuncturing function which involves inserting a neutral value for each known punctured bit. The size of the punctured set of code bits is determined by the bandwidth, power, and retransmission frequency of the system.

Receiver 19 decodes the data by turbo-decoding and determines whether the packet has been received in error. If so, then the received data samples corresponding to code bits C1 and C2 are maintained in memory. The receiver makes a request for more information, whereby some or all of the stored punctured bits are transmitted, via the channel, to the receiver. A second stage of turbo-decoding is performed, combining the data samples corresponding to punctured code bits P1 and P2 with the original received data samples corresponding to code bits C1 and C2. Advantageously, it is highly likely that decoding is correct at this point, resulting in highly reliable communication. However, depending upon the application, three or more transmission stages of turbo-decoding may be desirable.

Turbo-coding commonly involves the use of systematic convolutional codes for which input bits appear directly in the code output. To increase the rate of such a code, another form of puncturing may be applied wherein only one copy of the systematic bits is transmitted, which copy is used by all convolutional decoders in the turbo-decoding process. The staged transmission process described hereinabove may be applied to this form of puncturing as well. In particular, if a packet is received in error, a retransmission of the systematic bits is requested with the newly received samples applied to one or more convolutional decoders of the turbo-decoding algorithm.

Figure 2:
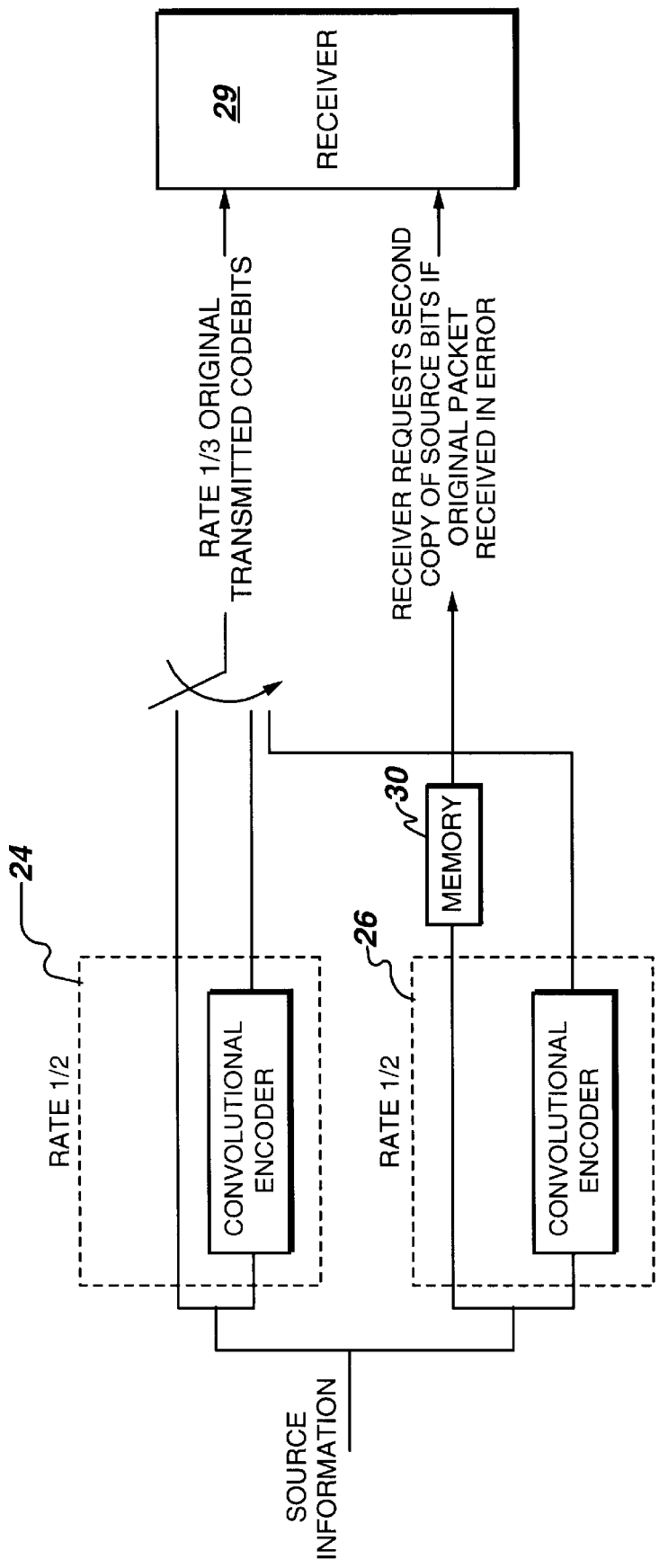
FIG. 2 is a block diagram illustrating turbo-coding with staged information transmission using rate 1/3 with systematic encoders according to an embodiment of the present invention.

FIG. 2 illustrates an example of turbo-decoding of a systematic code with staged information transmission. In this example, a rate 1/3 turbo code is created by transmitting the full code output of a rate 1/2 systematic convolutional encoder 24 operating on the original input sequence while transmitting only the parity bits of a second systematic convolutional encoder 26, also rate 1/2, operating on an interleaved copy of the input sequence. At a receiver 29, the received data samples corresponding to the systematic bits are used for both of the convolutional decoding components of the turbo code. The receiver requests a second copy of the systematic bits via memory 30 only if the first attempt at decoding results in a detected packet error. The received data samples corresponding to the second copy of the systematic bits is used for the second convolutional decoder component. Advantageously, the newly requested information is only 1/3 of the number of transmitted bits required in the classical automatic repeat request (ARQ) scheme.

Figure 3:
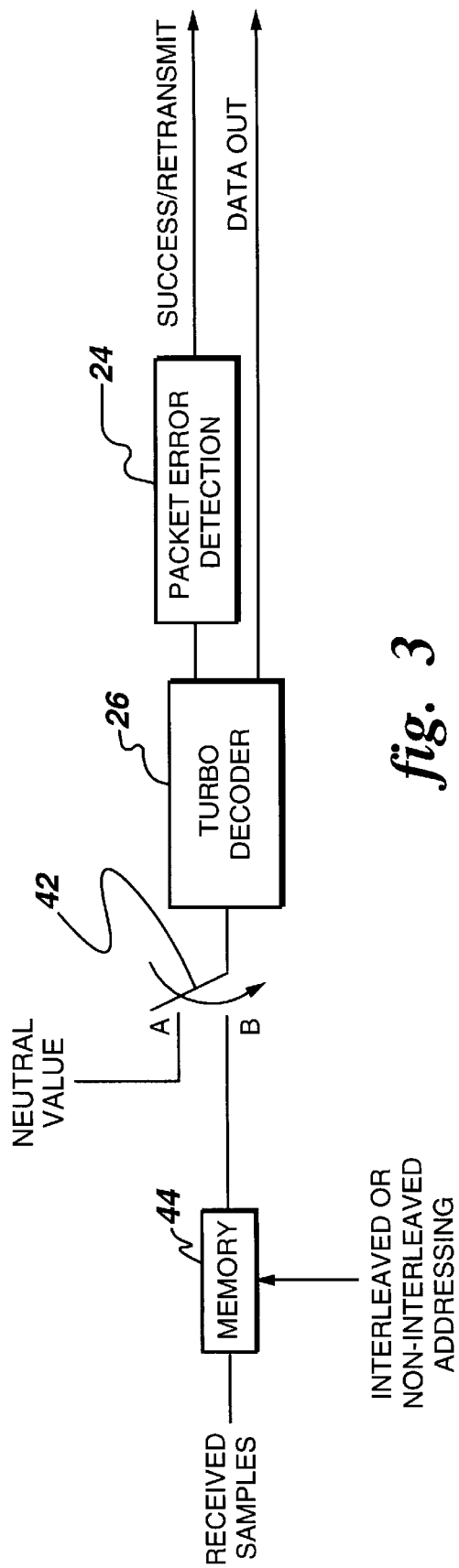
FIG. 3 is a block diagram illustrating a staged decoder according to an embodiment of the present invention.

FIG. 3 illustrates a staged turbo decoder 40 in a receiver according to an embodiment of the present invention. The input to decoder 40 is controlled by an input data selector 42. The received data samples corresponding to the transmitted code bits are copied into memory 44 in the first stage of transmission and are used in each iteration in the turbo decoding process. Memory 44 also allows systematic information that is common to encoder 1 and encoder 2 (FIGS. 1 and 2) to be transmitted only once in the first stage of turbo decoding. In the first stage of decoding, the data selector chooses A when the information has been punctured and chooses B when the received data samples are available. Memory 44 is addressed by the non-interleaving sequence when encoder 1 data is processed and by the interleaving sequence when encoder 2 data is processed.

After the first stage of turbo-decoding, a packet error detection mechanism 50 determines whether the data was received correctly. An exemplary packet error detection mechanism comprises a well-known 16-bit cyclic redundancy check (CRC) code. As described hereinabove, if a packet error is detected, a request for transmission of information previously punctured and/or for a second set of systematic data is made. The new information is also stored in memory 44. The second stage of decoding then takes place with the more complete information; i.e., the previously punctured information is combined with the new stage of information and decoded.

Figure 4:
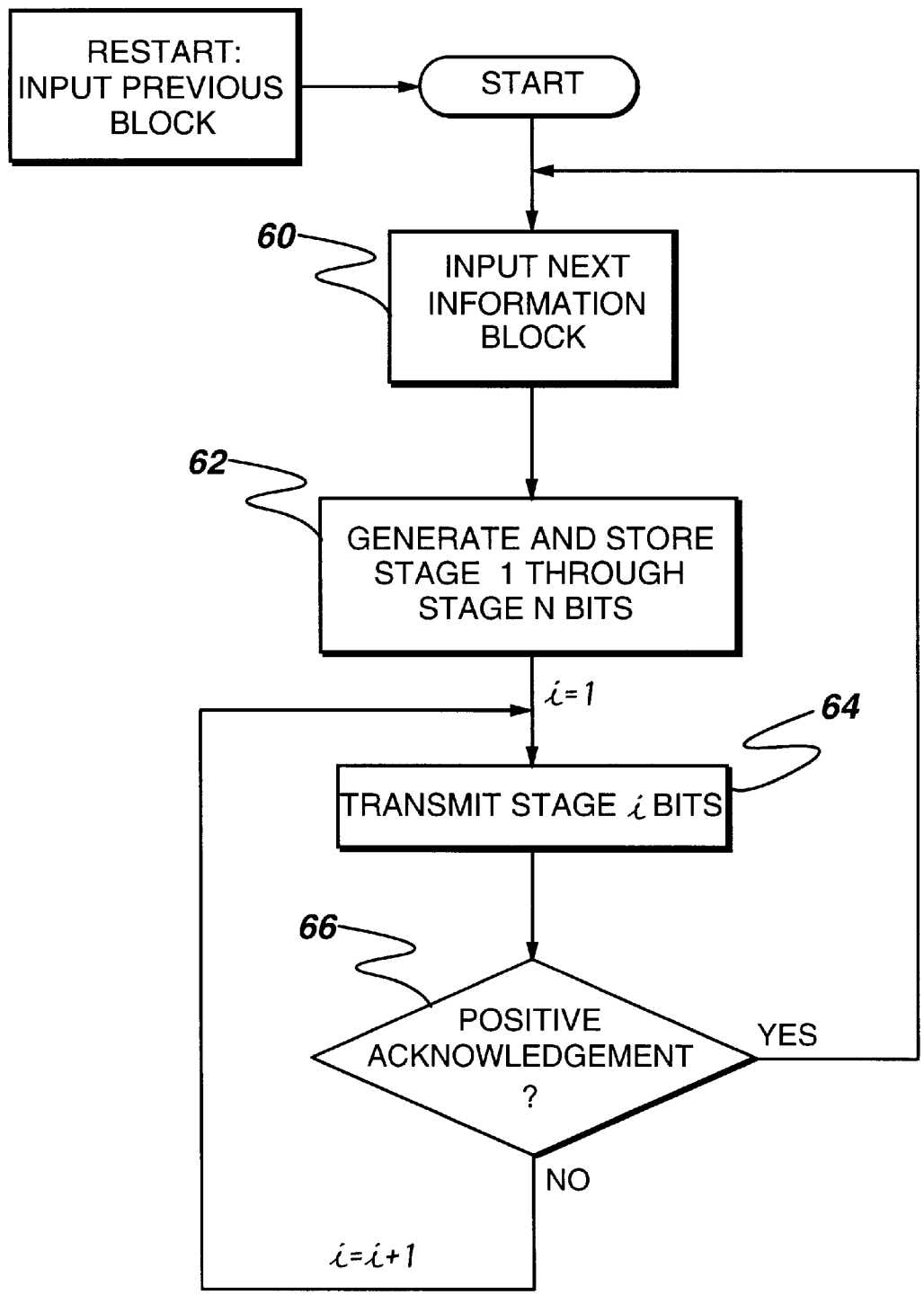
FIG. 4 is a flow chart illustrating staged information turbo-coding, i.e., at the transmitter, according to an embodiment of the present invention.

FIG. 4 is a flow chart illustrating turbo-coding at the transmitter end according to an embodiment of the present invention. In step 60, the first (or next) information block is provided to the transmitter. Step 62 involves generating and storing the stage one information through stage N bits. Stage i bits are transmitted in step 64. After the receiver determines whether there has been a packet transmission error, an indication of same is given to the transmitter in step 66. If positive acknowledgment (i.e., an indication of no error) is given, the process returns to step 60 wherein the next information block is provided to the transmitter. If an error is indicated (i.e., no positive acknowledgment), then the transmission stage i is incremented, and the process returns to step 64. The process continues by incrementing the information stage one until positive acknowledgment is made.

Figure 5:
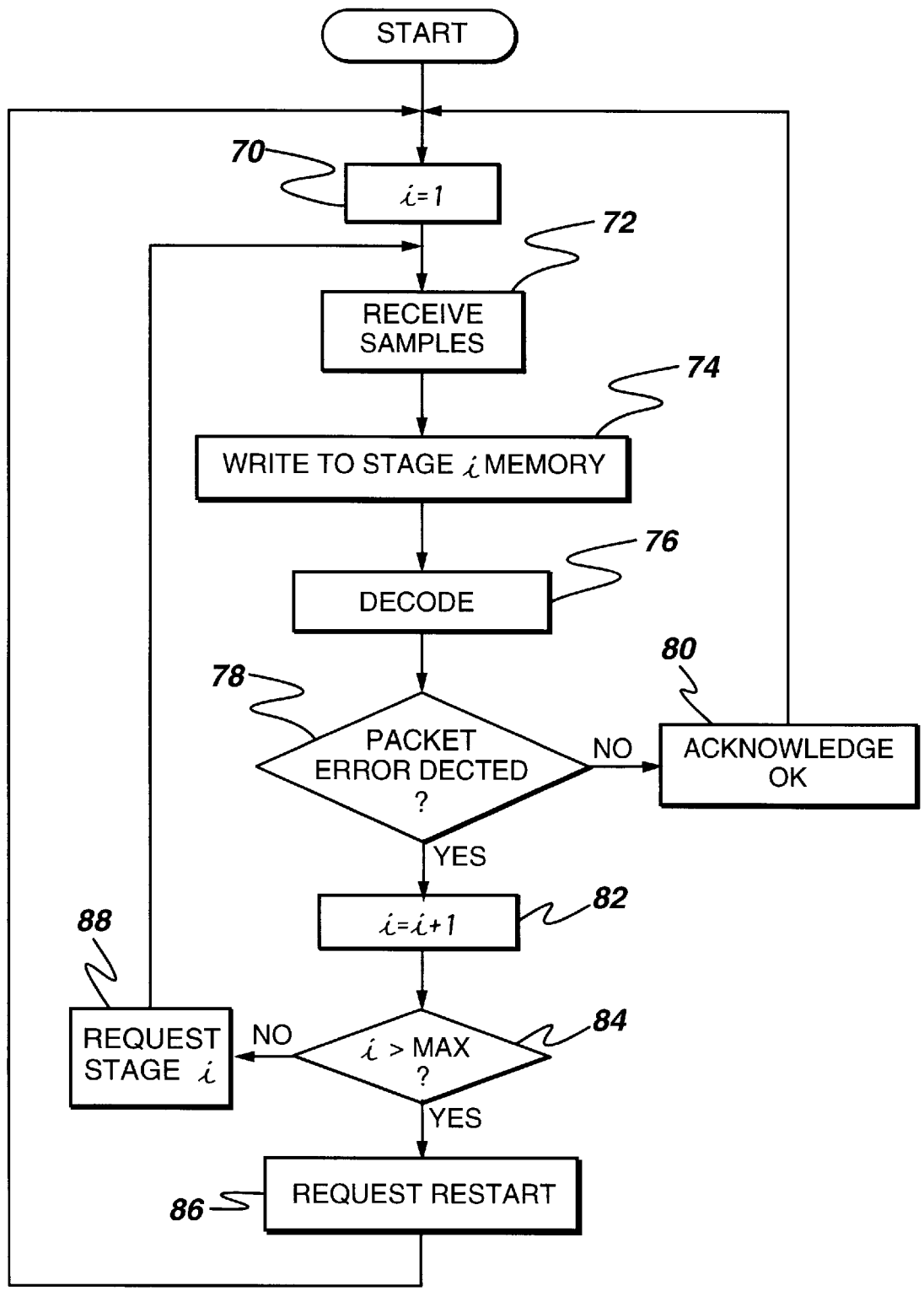
FIG. 5 is a flow chart illustrating stage information turbo-decoding according to an embodiment of the present invention.

FIG. 5 is a flow chart illustrating staged turbo-decoding, i.e., at the receiver end, according to an embodiment of the present invention. In step 70, the decoding stage i is set to one (1). In step 72, data samples are received, and in step 74, the received data samples are stored in memory. Turbo-decoding is performed in step 76, and a determination of a packet error is made in step 78. If not, then positive acknowledgment is made to the receiver in step 80. However, if a packet error is indicated in step 78, then the turbo-decoding stage i is incremented in step 82. A test is made in step 84 to determine whether a predetermined limit on the number of turbo-decoding stages (max) has been reached. If so, then a request to restart the turbo-decoding process is made in step 86. Otherwise, a request for stage i turbo-decoding is made in step 88, and the process returns to step 72.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for turbo-coding in a communications system, comprising:

turbo-encoding source information using a parallel concatenation of first and second convolutional codes, the step of turbo-encoding comprising first and second encoding steps, the first encoding step applying the first convolutional code to the source information to provide a first group of code bits, the second encoding step applying the second convolutional code to the source information after interleaving the source information to provide a second group of code bits;

puncturing the first and second groups of code bits;

storing the punctured first and second groups of code bits in memory;

transmitting the first and second groups of non-punctured code bits to a receiver via a channel;

storing data samples corresponding to the first and second groups of non-punctured code bits in memory;

turbo-decoding the data samples corresponding to the first and second groups of code bits in at least two decoding stages and determining whether the transmitted code bits have been received in error;

if a transmission error is detected, maintaining the data samples corresponding to the first and second groups of non-punctured code bits in memory and transmitting at least a predetermined portion of the stored punctured code bits to the receiver, and then turbo-decoding in at least two stages by combining the data samples corresponding to the first and second groups of non-punctured code bits with data samples corresponding to the transmitted punctured code bits.

2. The method of claim 1 wherein the step of puncturing comprises deleting code bits according to a predetermined puncturing pattern, and the step of turbo-decoding comprises a depuncturing function for inserting neutral values for the punctured bits.

3. The method of claim 1 wherein the first and second convolutional codes comprise systematic convolutional codes.

4. The method of claim 3 wherein the step of puncturing comprises transmitting a single copy of the first and second code bits, which copy is used in each turbo-decoding stage.

5. The method of claim 1 wherein the step of determining whether the code bits have been received in error comprises a 16-bit cyclic redundancy check code.

6. A communications system, comprising:

a transmitter comprising:

a turbo-encoder for turbo-encoding source information, said turbo-encoder comprising a parallel concatenation of first and second convolutional codes, the turbo-encoder applying the first convolutional code to the source information to provide a first group of code bits, and applying the second convolutional code to the source information after interleaving the source information to provide a second group of code bits;

a puncturing unit for puncturing the first and second groups of code bits;

memory for storing the punctured first and second groups of code bits;

said transmitter transmitting the first and second groups of non-punctured code bits via a channel to a receiver;

the receiver comprising:

memory for storing data samples corresponding to the first and second groups of non-punctured code bits;

a turbo-decoder for turbo-decoding the data samples corresponding to the first and second groups of code bits in at least two decoding stages and determining whether the transmitted code bits have been received in error; upon detection of a transmission error, the turbo-decoder maintaining the data samples corresponding to the first and second groups of non-punctured code bits in memory and requesting transmission of at least a predetermined portion of the stored punctured code bits to the receiver, the turbo-decoder then turbo-decoding in at least two stages by combining the data samples corresponding to the first and second groups of non-punctured code bits with data samples corresponding to the transmitted punctured code bits.

7. The system of claim 6 wherein the puncturing unit deletes code bits according to a predetermined puncturing pattern, and the decoder inserts neutral values for the punctured bits.

8. The system of claim 6 wherein the first and second convolutional codes comprise systematic convolutional codes.

9. The system of claim 6 wherein the puncturing unit transmits a single copy of the first and second code bits, which copy is used in each turbo-decoding stage.

10. The system of claim 6 wherein the decoder determines whether the code bits have been received in error by using a 16-bit cyclic redundancy check code.

* * * * *